United States Patent
He et al.

(10) Patent No.: US 8,917,129 B1
(45) Date of Patent: Dec. 23, 2014

(54) GENERATING SIGNALS WITH ACCURATE QUARTER-CYCLE INTERVALS USING DIGITAL DELAY LOCKED LOOP

(71) Applicant: Ambarella, Inc., Santa Clara, CA (US)

(72) Inventors: Guangjun He, Milpitas, CA (US); Xiaojun Zhu, Saratoga, CA (US)

(73) Assignee: Ambarella, Inc., Santa Clara, CA (US)

( * ) Notice: Subject to any disclaimer, the term of this patent is extended or adjusted under 35 U.S.C. 154(b) by 0 days.

(21) Appl. No.: 13/916,067

(22) Filed: Jun. 12, 2013

(51) Int. Cl.
*H03L 7/06* (2006.01)
*H03L 7/187* (2006.01)

(52) U.S. Cl.
CPC .................................. *H03L 7/187* (2013.01)
USPC ........................................... 327/159; 327/291

(58) Field of Classification Search
USPC .................................................. 327/291, 159
See application file for complete search history.

(56) References Cited

U.S. PATENT DOCUMENTS

| | | | | |
|---|---|---|---|---|
| 6,131,168 | A * | 10/2000 | Krzyzkowski | 713/503 |
| 7,012,985 | B1 * | 3/2006 | Nix | 377/48 |
| 2006/0267635 | A1 * | 11/2006 | Metz et al. | 327/2 |
| 2012/0206181 | A1 * | 8/2012 | Lin et al. | 327/199 |
| 2012/0224407 | A1 * | 9/2012 | Aleksic et al. | 365/129 |
| 2014/0002150 | A1 * | 1/2014 | Seo et al. | 327/156 |

* cited by examiner

*Primary Examiner* — Ryan Jager
(74) *Attorney, Agent, or Firm* — Christopher P. Maiorana, PC

(57) ABSTRACT

An apparatus comprising a delay circuit and a control circuit. The delay circuit may be configured to generate a plurality of intermediate signals in response to (i) a clock signal and (ii) an adjustment signal. The control circuit may be configured to generate the adjustment signal and a plurality of output signals having a quarter-cycle interval in response to (i) the plurality of intermediate signals and (ii) the clock signal.

17 Claims, 6 Drawing Sheets

GENERATING SIGNALS WITH ACCURATE QUARTER-CYCLE INTERVALS USING DIGITAL DELAY LOCKED LOOP

FIELD OF THE INVENTION

The present invention relates to timing circuits generally and, more particularly, to generating signals with accurate quarter-cycle intervals using digital delay locked loop.

BACKGROUND OF THE INVENTION

Quarter-cycle clock signals are used in conventional digital clock and data recovery circuits. Digital circuits that use quarter-cycle clock signals tend to operate more accurately and have improved bit error rates when receiving accurate quarter-cycle clock signals.

It would be desirable to implement a method and/or circuit for generating signals with accurate quarter-cycle intervals using digital delay locked loop that may ease the design and/or enhance performance of digital clock and data recovery circuits.

SUMMARY OF THE INVENTION

The present invention concerns an apparatus comprising a delay circuit and a control circuit. The delay circuit may be configured to generate a plurality of intermediate signals in response to (i) a clock signal and (ii) an adjustment signal. The control circuit may be configured to generate the adjustment signal and a plurality of output signals having a quarter-cycle interval in response to (i) the plurality of intermediate signals and (ii) the clock signal.

The objects, features and advantages of the present invention include providing a method and/or apparatus that may (i) generate signals with accurate quarter-cycle intervals using digital delay locked loop, (ii) provide an interpolation adjustment, (iii) provide a coarse delay adjustment stage in series with a fine delay adjustment stage, (iv) implement multiple replica interpolation stages and/or (v) implement a finite state machine.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
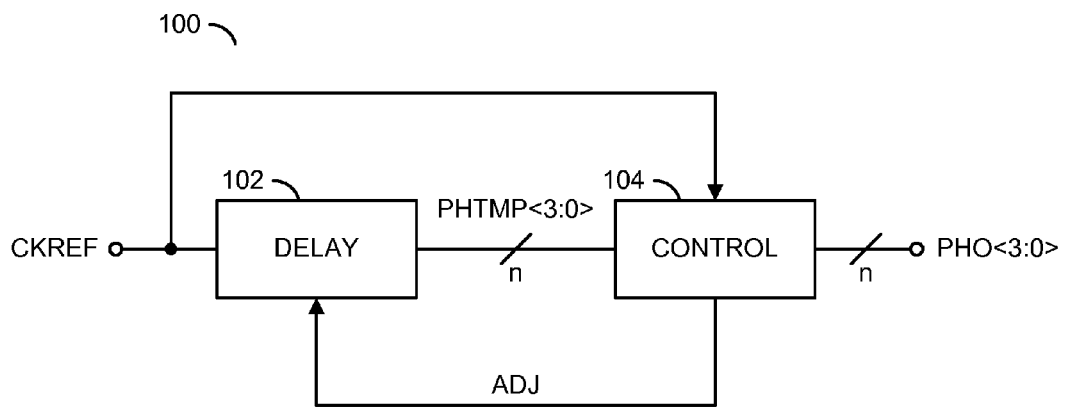
FIG. 1 is a block diagram of an embodiment of the invention.

Referring to FIG. 1, a block diagram of a circuit 100 is shown in accordance with a preferred embodiment of the present invention. The circuit 100 generally comprises a block (or circuit) 102, and a block (or circuit) 104. The circuit 100 may generate a signal (e.g., PHO<3:0>). The signal PHO<3:0> may be a quarter-cycle interval block signal. The circuit 104 may generate the signal PHO<3:0> in response to a signal (e.g., CKREF) and the signal PHTMP<3:0>. The circuit 104 may also generate a signal (e.g., ADJ) that may be presented to the circuit 102.

Figure 2:
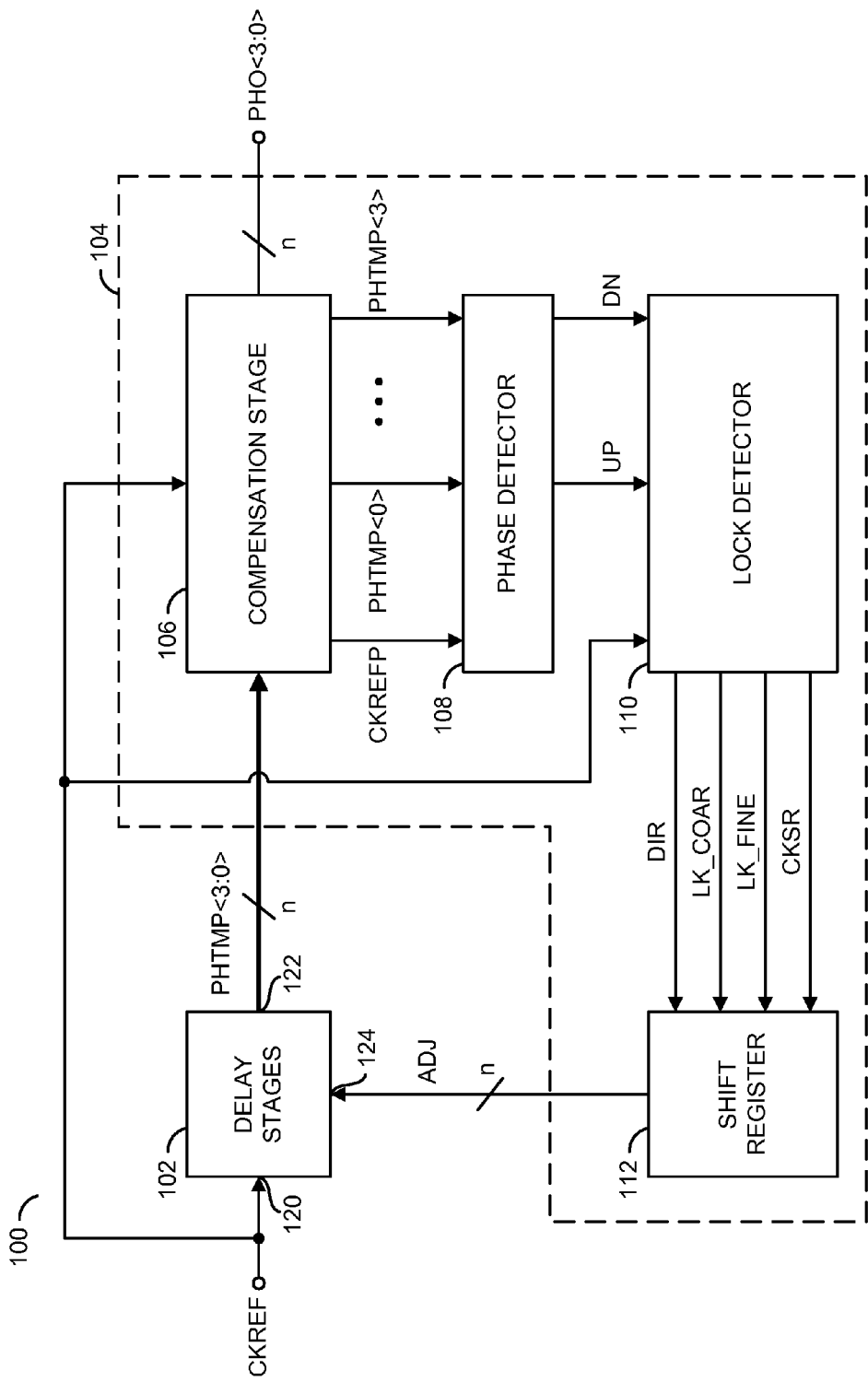
FIG. 2 is a block diagram of an embodiment of the invention.

Referring to FIG. 2, a more detailed diagram of the circuit 100 is shown. The circuit 104 is shown comprising a block (or circuit) 106, a block (or circuit) 108, a block (or circuit) 110 and a block (or circuit) 112. The circuit 102 may be implemented as a number of delay stages (to be described in more detail in connection with FIGS. 3 and 4). The circuit 102 may have an input 120 that may receive the signal CKREF. The signal CKREF may be a reference clock signal oscillating at a fixed frequency. The circuit 102 may have an output 122 that may present the signal PHTMP<3:0>. The signal PHTMP<3:0> may include a number of temporary (or intermediate) clock signals. The circuit 102 may also have an input 124 that may receive the signal ADJ from the circuit 112. The circuit 106 may be implemented as a compensation stage (or circuit). The circuit 108 may be implemented as a phase detector. The circuit 110 may be implemented as a lock detector. The circuit 112 may be implemented as a shift register. The compensation stage 106 may generate a signal (e.g., CKREFP). The compensation stage 106 may pass the signal PHTMP<3:0> through to the circuit 108. The phase detector 108 may generate a signal (e.g., UP) and a signal (e.g., DN). The lock detector 110 may generate a signal (e.g., DIR), a signal (e.g., LK_COAR), a signal (e.g., LK_FINE) and a signal (e.g., CKSR) in response to the signal CKREFP and the signals PHTMP<3:0>. The circuit 112 may generate the signal ADJ in response to the signals DIR, LK_COAR, LK_FINE and/or CKSR.

Figure 3:
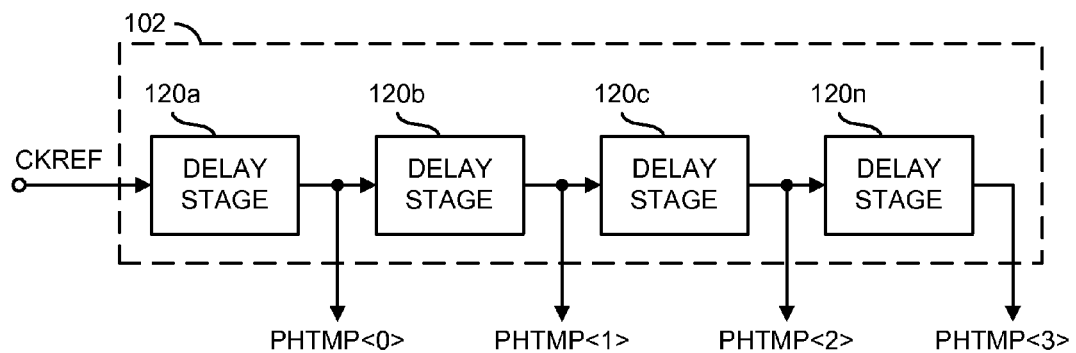
FIG. 3 is a diagram of the delay stages.

Referring to FIG. 3, a diagram of the delay stage block 102 is shown. The delay stage block 102 generally comprises a number of delay stages 120a-120n. Each of the delay stages 120a-120n generates one of the temporary clock signals PHTMP<0:3>. For example, the delay stage 120a generates the signal PHTMP<0>. The delay stage 120b generates the signal PHTMP<1>. The delay stage 120c generates the signal PHTMP<2>. The delay stage 120n generates the signal PHTMP<3>.

Figure 4:
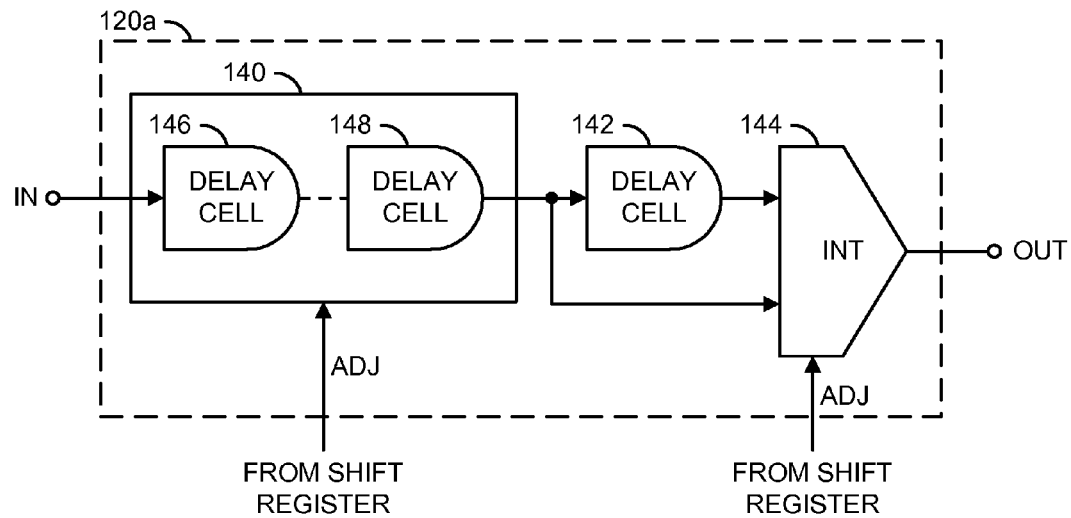
FIG. 4 is a more detailed diagram of the delay stages.

Referring to FIG. 4, a more detailed diagram of the delay stage 120a is shown. Each of the delay stages 120b-120n may have a similar implementation. The delay stage 120a is shown receiving an input signal (e.g., IN) and generating an output signal (e.g., OUT). The signal IN may be the signal CKREF (for the delay stage 120a), or may be one of the signals PHTMP<0:3> (for the delay stages 120b-120n). The circuit 120a is shown having a block (or circuit) 140, a block (or circuit) 142 and a block (or circuit) 144. The block (or circuit) 140 may be implemented as a block (or circuit) 146 and a block (or circuit) 148. The circuits 142, 146 and/or 148 may be implemented as delay cells. The circuit 144 may be implemented as an interpolator. The circuit 140 may receive the signal ADJ from the shift register 112. The circuit 140 may implement a coarse delay adjustment. Similarly, the circuit 144 may receive the signal ADJ from the shift register 112. The circuit 142 and/or 144 may implement a fine delay adjustment.

Figure 5:
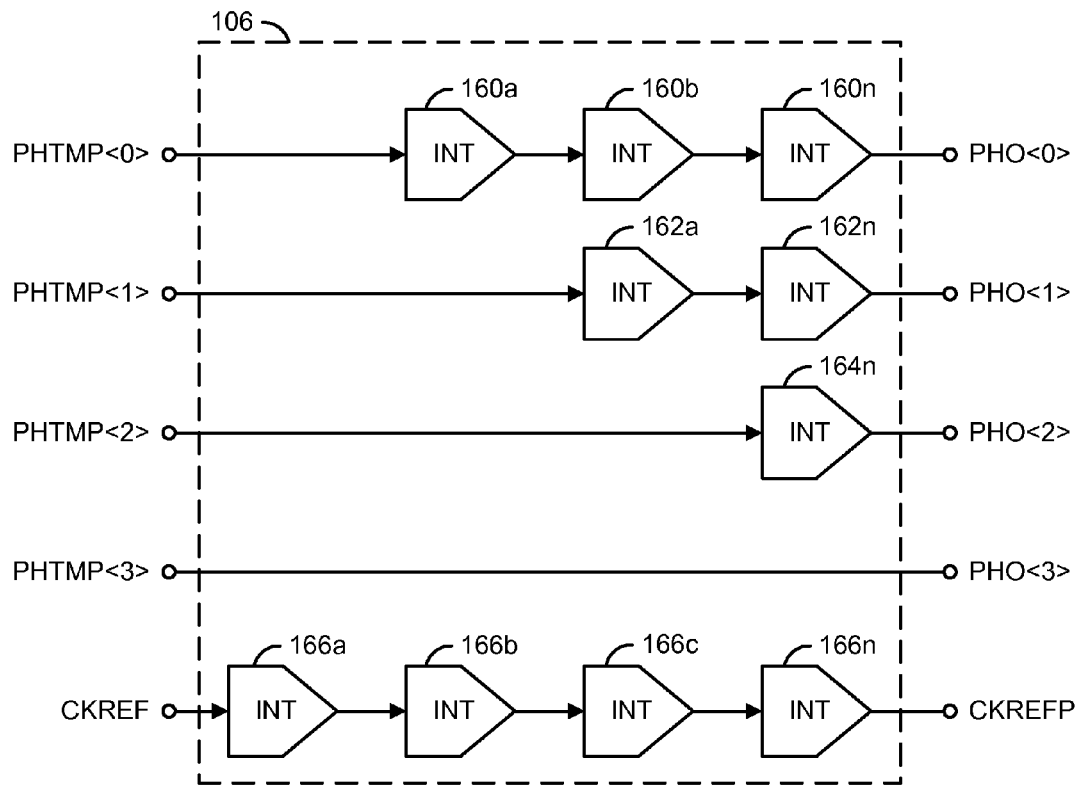
FIG. 5 is a diagram of the compensation stage.

Referring to FIG. 5, a more detailed diagram of the compensation circuit 106 is shown. A path from the signal PHTMP<0> is shown through a number of elements 160a-160n to generate the signal PHO<0>. Similarly, a path from the signal PHTMP<1> is shown through the elements 162a and 162n to generate the signal PHO<1>. The signal PHTMP<2> is shown going through an element 164n to generate the signal PHO<2>. The signal PHTMP<3> is shown passed directly to generate the signal PHO<3>. The signal CKREF is shown passing through elements 166a-166n to generate the signal CKREFP. The circuits 160a-160n, 162a-162n, 164n and/or 166a-166n may be implemented as interpolator circuits.

Figure 6:
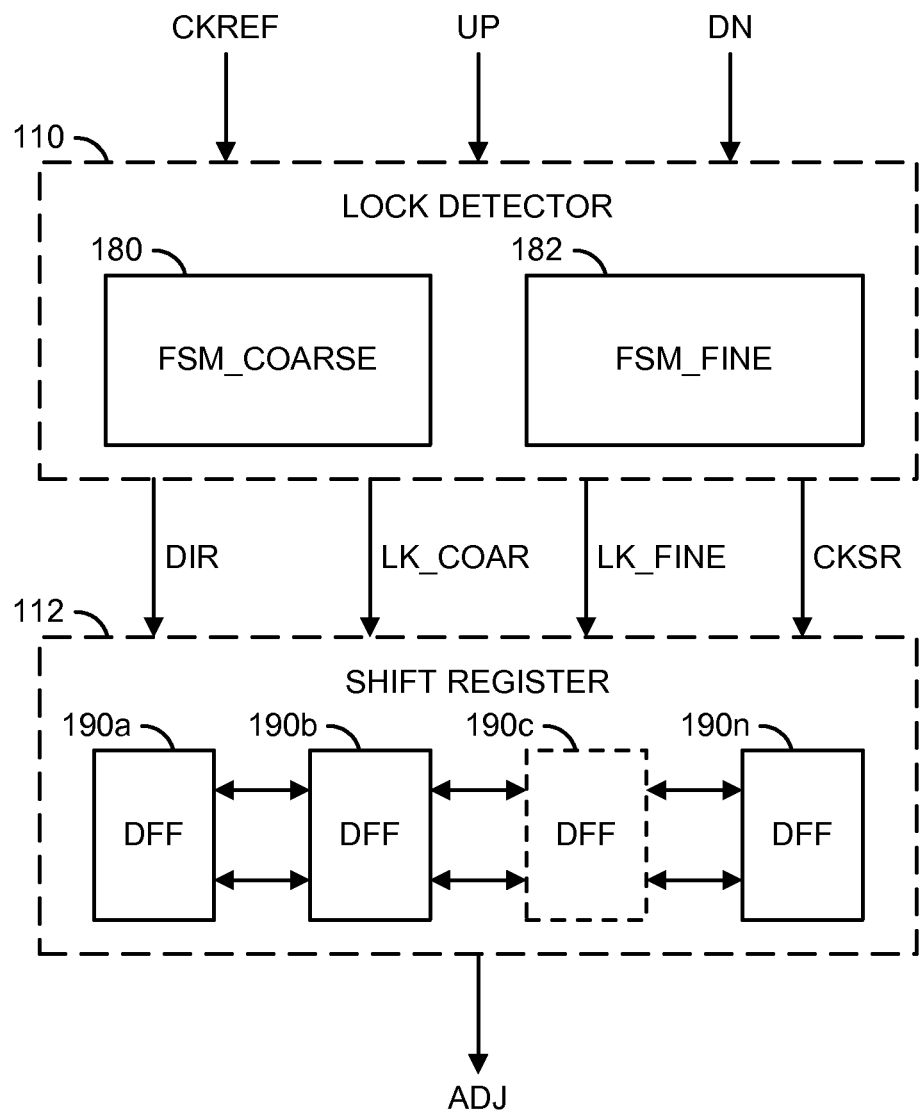
FIG. 6 is a diagram of details of the lock detector and the shift register of FIG. 2.

Referring to FIG. 6, a more detailed diagram of the lock detector 110 and the shift register 112 is shown. The lock detector 110 generally comprises a block (or circuit) 180 and a block (or circuit) 182. The circuit 180 may be implemented as a finite state machine. In one example, the circuit 180 may be implemented as a coarse finite state machine. In one example, the circuit 182 may be implemented as a fine finite state machine. Details of the state machine 180 (and/or the state machine 182) are described in more detail in connection with FIG. 8.

The circuit 110 is shown generating the signals DIR, LK_COAR, LK_FINE, and CKSR. The signal LK_COAR may be implemented as a coarse lock signal. The signal LK_FINE may be implemented as a fine lock signal. The signal LK_COAR and the signal LK_FINE may be used by the shift register 112 to adjust the signal ADJ, which is used to control the delay stage 102. The shift register 112 is shown comprising a number of circuits 190a-190n. Each of the circuits 190a-190n may be implemented as a flip-flop circuit. In one example, the circuits 190a-190n may be implemented as D-type flip-flop circuits. However, other logic elements may be implemented to meet the design criteria of a particular implementation.

Figure 7:
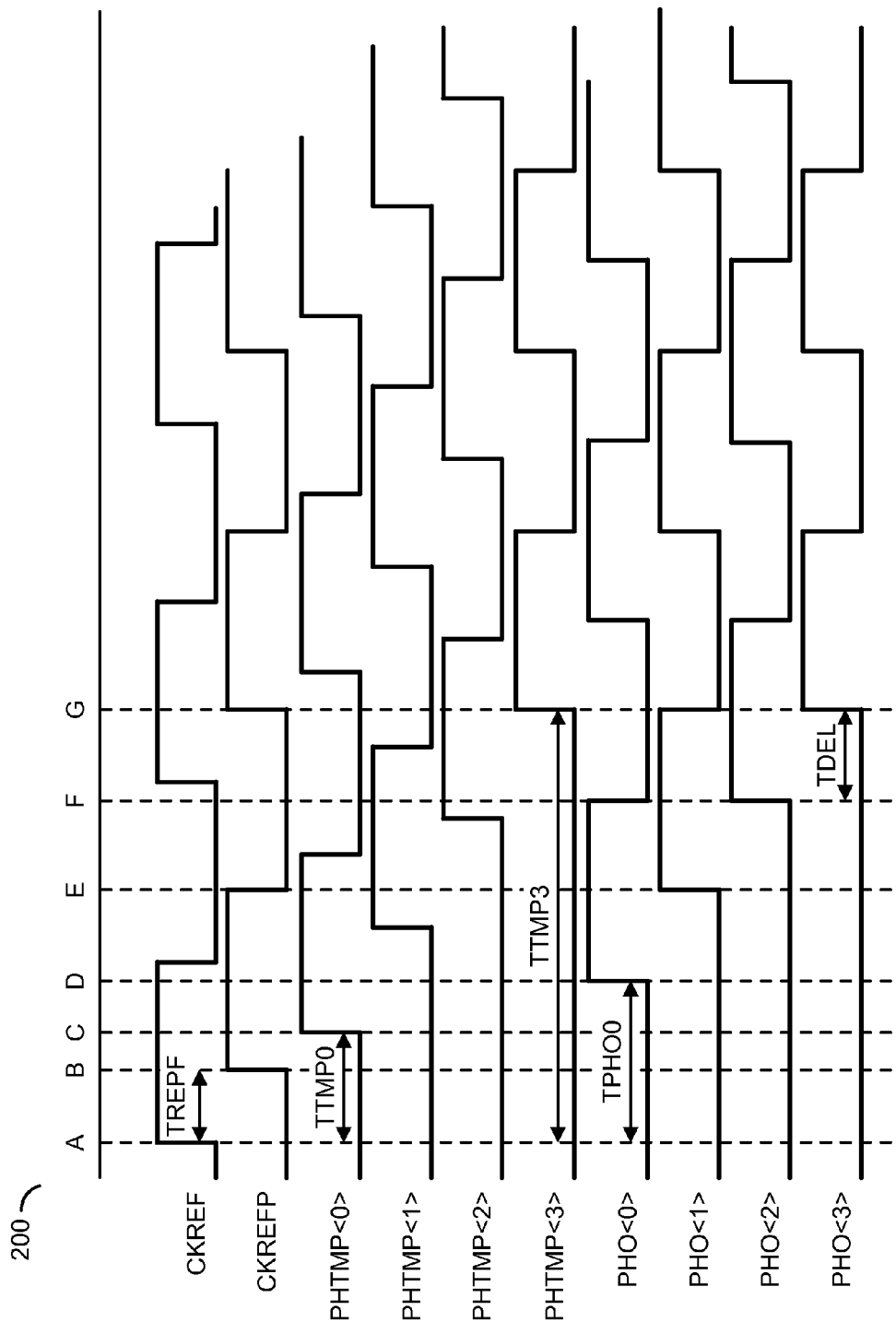
FIG. 7 is a timing diagram of the various signals.

Referring to FIG. 7, a timing diagram 200 is shown. The timing diagram 200 shows the signals CKREF, CKREFP, PHTMP<0>, PHTMP<1>, PHTMP<2>, PHTMP<3>, PHO<0>, PHO<1>, PHO<2> and PHO<3>. The signal CKREFP is generally a delayed version of the signal CKREF. The signal CKREFP may be compared with the signal PHTMP<3> by the phase detector 108. The delay from the signal CKREF to the signal CKREFP (e.g., $t_{refp}$), is normally $4*t_{int}$, where $t_{int}$ is the intrinsic delay of one of the interpolation stages (e.g., 140, 160a-160n, etc.). The delay from the signal CKREF to the signal PHTMP<0> is shown as $(t_{int}+(n+m)*t_0)$, where n is the amount of coarse delay set by the signal ADJ in a first locking, m is the amount of interpolation weight set by the signal ADJ in a second locking, and $t_0$ is the intrinsic delay of the coarse delay cell 146 (in FIG. 4). The delay from the signal CKREF to the signal PHTMP<1> is shown as $2*(t_{int}+(n+m)*t_0)$. The delay from the signal CKREF to the signal PHTMP<2> is shown as $3*(t_{int}+(n+m)*t_0)$. The delay from the signal CKREF to the signal PHTMP<3> is $t_{tmp3}$, with the value of $4*(t_{int}+(n+m)*t_0)$. The delay from the signal CKREFP to the signal PHTMP<3> is $4*(n+m)*t0$=one clock cycle of reference clock $t_{in}$, and $(n+m)*t0=0.25*t_{in}$.

After compensation, a delay TPHO0 (e.g., the delay from the signal CKREF to the signal PHO<0>) is shown as $4*t_{int}+(n+m)*t_0$. The delay from the signal CKREF to the signal PHO<1> is shown as $4*t_{int}+2*(n+m)*t_0$. The delay from the signal CKREF to the signal PHO<2> is shown as $4*t_{int}+3*(n+m)*t_0$. The delay between the signal PHO<0> and the signal PHO<1> is $(n+m)*t0$. The delay between the signal PHO<1> and the signal PHO<2> is $(n+m)*t0$. The delay between the signal PHO<2> and the signal PHO<3> is $(n+m)*t0$. The value m and t0 may be used to define a minimum fine adjustment step. In one example, the minimum fine adjustment step may be smaller than 1 ps.

The circuit 100 may implement a double locking design. The lock detector 110 may implement the two state machines 180 and 182 to generate the signal FSM_COAR and the signal FSM_FINE. A lock is detected (or not) based on the signals UP/DN from the phase detector 108. The shift register 112 shifts up or down to adjust the delay stages 120a-120n by feeding the control signal bus of the signal ADJ. In the first locking, the signal ADJ may either select or bypass the delay cells 146 and 148 in the circuit 140. Once the first locking is achieved, the signal LK_COAR may be asserted high. A second locking may be acquired by the signal FSM_FINE (e.g., in the lock detector 110) to move the shift register 112 up or down to generate another set of control signals of the signal ADJ used to adjust the interpolation weight in the interpolator 144 (of the circuit in 102) in each of the delay stages 120a-120n. Once the signal LK_FINE is asserted, an output from the shift register 112 may be latched to produce stable outputs from the delay stages 120a-120n.

Figure 8:
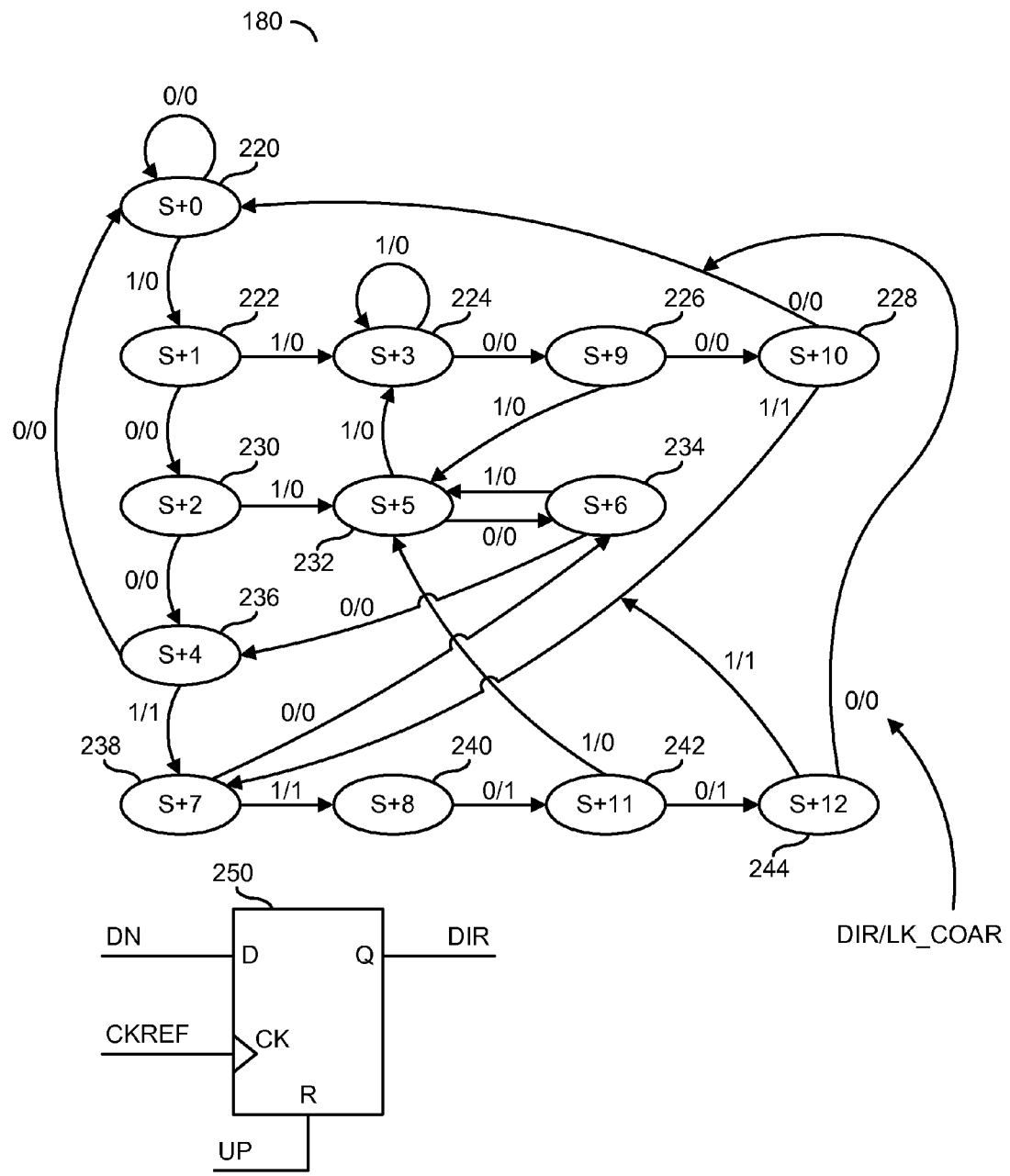
FIG. 8 is an example of a state machine.

Referring to FIG. 8, a diagram of the state machine 180 is shown. The state machine 182 may have a similar implementation. The state machine 180 generally comprises a state 220, a state 222, a state 224, a state 226, a state 228, a state 230, a state 232, a state 234, a state 236, a state 238, a state 240, a state 242, and a state 244. The state machine begins in the state 220. In a 0/0 condition, the state machine 180 remains in the state 220. In a 1/0 condition, the state machine moves to the state 222. In the state 222, in a 0/0 condition, the state machine 180 moves to the state 230. In a 1/0 condition, the state machine moves to the state 224. The state machine 180 remains in the state 224 in a 1/0 condition. After a 0/0 condition, the state machine 180 transitions to the state 226. In the state 226, the state machine transitions to the state 228 after a 0/0 condition. In a 1/0 condition, the state machine 180 transitions to the state 232. The other states shown have similar transitions as the state described. The condition 0/0, 1/0, 1/1, or 0/1 generally represents the state of the signal DIR and/or the signal LK_COAR (e.g., the first number may be the signal DIR and the second number may be the signal LK_COAR). An example of one of the states 220-244 is shown by the register 250. The signal DIR is presented from a Q output. The signal DN is presented to a D input. The signal CKREF is presented to a clock input. The signal UP is presented to a reset input.

The circuit 100 may be used to generate the signals PHO<3:0>. Each of the signals PHO<3:0> may have an accurate quarter-cycle interval determined by the digital delay locked loop circuit 104. The digital delay locked loop circuit 104 includes the phase detector 108, the lock detector 110, the delay stages circuit 102, and the compensation circuit 106. Phase interpolation is used in each of the delay stages 120a-120n to make the tuning step less than a predetermined interval (e.g., less than fps). The output signals PHTMP<3:0> generated by the delay stages in the block 102 generally have an accurate quarter-cycle interval after being compensated in the compensation circuit 106.

In one example, the circuit 100 may generate the output signals PHO<3:0>, each having accurate quarter-cycle intervals. The circuit 100 may receive the reference clock signal CKREF, generate the multiple intermediate clock signals PHTMP<3:0> from the reference clock signal CKREF using the delay stages 120a-120n, interpolate a value of the coarse delay to use a small delay adjustment step, and compensate for the intrinsic delays of the interpolation stages.

The circuit 106 may compare the output from the last one of the delay stages 120a-120n to the delayed version of the reference clock signal CKREFP. The lock detection circuit 110 may lock the output from the last one of the delay stages 120a-120n to the delayed version of the reference clock CKREFP with only a coarse delay adjustment. The lock detection circuit 110 may lock the output from the last of the delay stages 120a-120n to the delayed version of the reference clock CKREFP with both a coarse delay adjustment and an interpolation delay adjustment.

In one example, the coarse delay adjustment stage may comprise multiple coarse delay cells in series. The interpolation circuit 120a may comprise the coarse delay cell 140 and/or the interpolation stage 144. The interpolation adjustment stage 106 may comprise multiple interpolation cells (e.g., 160a-160n, 162a-162n, 164n and/or 166a-166n) in parallel. The compensation stage comprises multiple replicas of interpolation stages. The clock detection 110 may include the finite state machine 180 and the finite state machine 182.

In one example embodiment, a method may include generating four output signals PHO<3:0> with accurate quarter-cycle intervals. The method comprises receiving a reference clock signal, generating the clock signals while the reference clock goes through four delay stages in series, comparing the output of the last delay stage with a delayed version of the reference clock signal, detecting whether the loop is in lock, and adjusting the delay stages and compensating of the four clock signals.

Such a method may include comparing of the output of the last delay stage with the delayed version of the reference clock signal CKREF comprising a phase detector having a first input, a second input, a third input, a first output and a second output. The first input may receive the delayed version of the reference clock signal CKREF. The second input may receive the output from the first delay stage. The third input may receive the output from the last delay stage. The first output may indicate that the third input lags the next cycle of the first input. The second output may indicate that the third input leads the next cycle of the first input.

Each delay stage that generates the quarter-cycle delay comprises a coarse delay adjustment stage having a first input, a second input and an output. The first input may receive the signal to be delayed. The second input may receive the adjustment amount. The output may be the delayed signal. A phase interpolation stage may have a first input, a second input and an output. The first input may receive the signal to be delayed. The second input may receive the interpolation amount. The output may be the delayed signal.

Adjusting the delay stages comprises using a shift register having a first input, a second input, a third input, a fourth input and an output. The first input controls the shifting direction. The second input controls the locking status of the coarse delay adjustment. The third input controls the locking status of the interpolation delay adjustment. The fourth input is the shifting clock. The output controls the adjustment amount for the coarse delay adjustment and/or the interpolation delay adjustment.

The detecting the loop comprises a lock detector and a bandwidth adjustment cell. The lock detector may have a first input, a second input, a third input, a first output, a second output, a third output and a fourth output. The first input may receive the reference clock. The second input may receive the first output from the phase detector. The third input may receive the second output from the phase detector. The first output shows the direction of the shift register. The second output shows the locking status of the coarse delay adjustment. The third output shows the locking status of the interpolation delay adjustment. The fourth output gives the clock for the shift register. The bandwidth adjustment cell may adjust the loop bandwidth. The outputs from delay stages and the reference clock connect through replicas of the interpolation stage to compensate for the intrinsic interpolation delay.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a delay circuit configured to generate a plurality of intermediate signals in response to (i) a clock signal and (ii) an adjustment signal; and
    a control circuit configured to generate said adjustment signal and a plurality of output signals having a quarter-cycle interval in response to (i) said plurality of intermediate signals and (ii) said clock signal, wherein (a) said control circuit includes a compensation stage configured to generate said plurality of output signals having less intrinsic delay than said plurality of intermediate signals and (b) said compensation stage passes said plurality of intermediate signals and an inverted version of said clock signal.

2. The apparatus according to claim 1, wherein said clock signal comprises a reference clock oscillating at a fixed frequency.

3. The apparatus of claim 1, wherein said control circuit further comprises:
    a comparison circuit configured to compare the output from a last of a plurality of delay stages to a delayed version of the clock signal;
    a first locking circuit configured to lock the output from the last of the delay stages to the delayed version of the clock signal with coarse delay adjustment only; and
    a second locking circuit configured to lock the output from the last of the delay stages to the delayed version of the clock signal with both coarse delay adjustment and interpolation delay adjustment.

4. The apparatus of claim 3, wherein the comparison circuit comprises a phase detector.

5. The apparatus of claim 4, wherein the first locking circuit comprises a first finite state machine and the second locking circuit comprises a second finite state machine.

6. The apparatus of claim 1, wherein the delay circuit comprises multiple delay stages connected in series.

7. The apparatus of claim 6, wherein the delay stages comprise a coarse delay adjustment stage and a fine delay adjustment stage.

8. The apparatus of claim 7, wherein the coarse delay adjustment stage comprises multiple coarse delay cells connected in series.

9. The apparatus of claim 6, wherein the fine delay adjustment stage comprises a coarse delay cell.

10. The apparatus of claim 1, wherein the compensation stage comprises multiple interpolation cells operating in parallel.

11. A method for generating four output signals with accurate quarter-cycle intervals, the method comprising:
    receiving a reference clock signal;
    generating four clock signals while the reference clock signal goes through a plurality of delay stages connected in series;
    comparing the output of a last delay stage of the plurality of delay stages with a delayed version of the reference clock signal;
    detecting whether a feedback loop is in lock with said delayed version of the reference clock signal;
    adjusting the delay stages; and
    compensating of the four clock signals, wherein (a) each delay stage comprises a coarse delay adjustment stage having (i) a first input for receiving a signal to be delayed, (ii) a second input for receiving an adjustment amount and (iii) an output for presented a delayed signal and (b) a phase interpolation stage is configured having (i) a first input for receiving the signal to be delayed, (ii) a second input for receiving an interpolation delay adjustment and (iii) an output for presenting the delayed signal.

12. The method of claim 11, wherein comparison of the output of the last delay stage with the delayed version of the reference clock signal comprises:

a phase detector having a first input, a second input, a third input, a first output and a second output, wherein the first input is the delayed version of the reference clock signal, the second input is the output from a first delay stage, the third input is the output from the last delay stage, the first output is to indicate the third input lags the next cycle of the first input and the second output is to indicate the third input leads the next cycle of the first input.

13. The method of claim 11, wherein adjusting the delay stages comprises a shift register having a first input, a second input, a third input, a fourth input and an output, wherein the first input controls the shifting direction, the second input controls the locking status of the coarse delay adjustment, the third input controls the locking status of the interpolation delay adjustment, the fourth input is the shifting clock, and the output controls the adjustment amount for the coarse delay adjustment or the interpolation delay adjustment.

14. The method according to claim 13, wherein said coarse delay adjustment stage comprises multiple coarse delay cells in series to be selected by the output from the shift register.

15. The method according to claim 13, wherein a compensation stage comprises multiple interpolation cells operating in parallel.

16. The method of claim 13, wherein detecting the loop comprises:

a) a lock detector having a first input, a second input, a third input, a first output, a second output, a third output and a fourth output, wherein the first input is the reference clock, the second input is the first output from the phase detector, the third input is the second output from the phase detector, the first output shows the direction of the shift register, the second output shows the locking status of the coarse delay adjustment, the third output shows the locking status of the interpolation delay adjustment, and the fourth output gives the clock for the shift register; and b) a bandwidth adjustment cell which adjusts the loop bandwidth.

17. An apparatus comprising:

a delay circuit configured to generate a plurality of intermediate signals in response to (i) a clock signal and (ii) an adjustment signal;

a control circuit configured to generate said adjustment signal and a plurality of output signals having a quarter-cycle interval in response to (i) said plurality of intermediate signals and (ii) said clock signal;

a comparison circuit to compare the output from a last of a plurality of delay stages to a delayed version of the clock signal;

a first locking circuit to lock the output from the last delay stage to the delayed version of the clock signal with coarse delay adjustment only; and a second locking circuit to lock the output from the last delay stage to the delayed version of the clock signal with both coarse delay adjustment and interpolation delay adjustment.

* * * * *